US010906295B2

(12) United States Patent
Yokoi et al.

(10) Patent No.: US 10,906,295 B2
(45) Date of Patent: Feb. 2, 2021

(54) PRINTING APPARATUS AND PRINTING SYSTEM

(71) Applicant: FUJI CORPORATION, Chiryu (JP)

(72) Inventors: Yoshimune Yokoi, Kiyosu (JP); Ritsuo Hirukawa, Nishio (JP); Shoji Fukakusa, Yokkaichi (JP); Naoki Matsuzaki, Nishio (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/464,974

(22) PCT Filed: Dec. 5, 2016

(86) PCT No.: PCT/JP2016/086104
§ 371 (c)(1),
(2) Date: May 29, 2019

(87) PCT Pub. No.: WO2018/105018
PCT Pub. Date: Jun. 14, 2018

(65) Prior Publication Data
US 2019/0291410 A1    Sep. 26, 2019

(51) Int. Cl.
*B41F 35/00* (2006.01)
*B41F 15/12* (2006.01)
(Continued)

(52) U.S. Cl.
CPC ............ *B41F 35/005* (2013.01); *B41F 15/08* (2013.01); *B41F 15/12* (2013.01); *B41F 15/36* (2013.01);
(Continued)

(58) Field of Classification Search
CPC ..................................................... B41F 35/005
(Continued)

(56) References Cited

U.S. PATENT DOCUMENTS 5,271,325 A * 12/1993 Price ................. B41F 35/003
101/423
5,918,544 A * 7/1999 Doyle ................ B41F 35/00
101/423
(Continued)

FOREIGN PATENT DOCUMENTS

EP    2 818 320 A1    12/2014
JP    4-107146 A    4/1992
(Continued)

OTHER PUBLICATIONS

International Search report dated Feb. 21, 2017 in PCT/JP2016/086104 filed Dec. 5, 2016.

*Primary Examiner* — Anthony H Nguyen
(74) *Attorney, Agent, or Firm* — Oblon, McClelland, Maier & Neustadt, L.L.P.

(57) ABSTRACT

A printing apparatus including: a cleaning section including a cleaning member and configured to perform cleaning processing of a screen mask used in printing of a viscous fluid onto a print target; a cleaning member moving section configured to perform at least one of moving the cleaning member to and from a cleaning position and an exchange position, and unloading and loading of the cleaning member; and an exchange control section configured to control the cleaning member moving section to perform cleaning member exchange processing of exchanging the cleaning member.

7 Claims, 8 Drawing Sheets

(51) Int. Cl.
*B41F 15/36* (2006.01)
*B41F 15/44* (2006.01)
*H05K 3/12* (2006.01)
*B41F 15/08* (2006.01)

(52) U.S. Cl.
CPC .............. *B41F 15/44* (2013.01); *B41F 35/00* (2013.01); *H05K 3/12* (2013.01); *H05K 3/1216* (2013.01); *B41P 2235/246* (2013.01)

(58) Field of Classification Search
USPC ........................................................ 101/425
See application file for complete search history.

(56) References Cited

U.S. PATENT DOCUMENTS

| | | | |
|---|---|---|---|
| 8,794,138 B2* | 8/2014 | Willshere | B41F 15/0881 |
| | | | 101/123 |
| 2005/0183600 A1 | 8/2005 | Perault et al. | |
| 2012/0000380 A1* | 1/2012 | Tanaka | B41F 35/005 |
| | | | 101/114 |
| 2013/0087057 A1 | 4/2013 | Kondo et al. | |
| 2013/0106041 A1* | 5/2013 | Noda | B41F 15/36 |
| | | | 269/58 |
| 2014/0047990 A1* | 2/2014 | Fujii | B41F 15/0881 |
| | | | 101/123 |
| 2015/0009524 A1 | 1/2015 | Fujimoto et al. | |
| 2015/0090770 A1* | 4/2015 | Mantani | B23K 37/0408 |
| | | | 228/102 |

FOREIGN PATENT DOCUMENTS

| | | |
|---|---|---|
| JP | H04-201255 A | 7/1992 |
| JP | 10-138451 A | 5/1998 |
| JP | 2003-170564 A | 6/2003 |
| JP | 2011-230353 A | 11/2011 |
| JP | 2013-169723 A | 9/2013 |
| JP | WO 2014/030212 A1 | 7/2016 |
| WO | WO 2014/184147 A1 | 11/2014 |

* cited by examiner

PRINTING APPARATUS AND PRINTING SYSTEM

TECHNICAL FIELD

The present disclosure relates to a printing apparatus and a printing system.

BACKGROUND ART

Conventionally, in a printing apparatus that performs printing of a viscous fluid using a screen mask onto a print target such as a board, there is an apparatus that performs automatic exchange of the screen mask. For example, disclosed in patent literature 1 is a printing apparatus provided with a rod that protrudes downwards, and a sliding member that, by sliding the rod, slides the screen mask and pushes it to a main body frame.

CITATION LIST

Patent Literature

Patent literature 1: JP-A-H04-107146

BRIEF SUMMARY

Technical Problem

There are cases in which a printing apparatus includes a cleaning member that cleans a screen mask, and exchange is also required of this cleaning member. However, in a printing apparatus of patent literature 1, nothing is disclosed regarding cleaning member exchange. Conventionally, exchange of a cleaning member is performed manually by an operator, so with such a printing apparatus it is desirable to reduce the work of an operator.

The present disclosure solves the above problems and an object thereof is to enable automatic exchange of a cleaning member of a printing apparatus.

Solution to Problem

The present disclosure employs the following means to achieve the above object.

A printing apparatus of the present disclosure includes: a cleaning section including a cleaning member and configured to perform cleaning processing of a screen mask used in printing of a viscous fluid onto a print target; a cleaning member moving section configured to perform at least one of moving the cleaning member to and from a cleaning position and an exchange position, and unloading and loading of the cleaning member; and an exchange control section configured to control the cleaning member moving section to perform cleaning member exchange processing of exchanging the cleaning member.

The printing apparatus is provided with a cleaning member moving section configured to perform at least one of moving the cleaning member to and from a cleaning position and an exchange position, and unloading and loading of the cleaning member. Further, the printing apparatus is configured to perform exchange processing of exchanging the cleaning member using the cleaning member moving section. Thus, the printing apparatus is able to perform automatic exchange of the cleaning member. Here, an "exchange position" includes a transfer position and a receive position.

DESCRIPTION OF EMBODIMENTS

Figure 1:
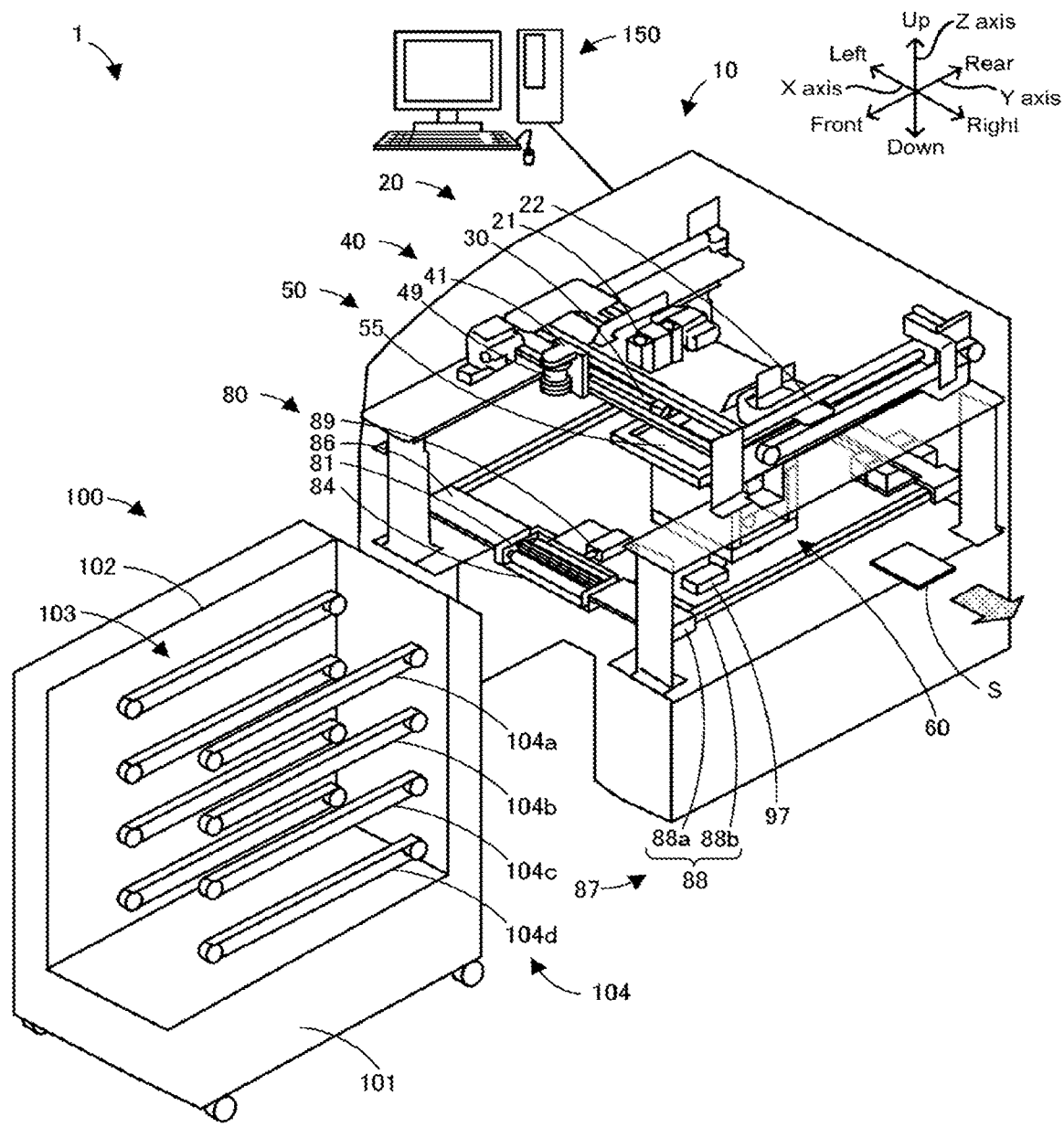
FIG. 1 shows an example of the overall configuration of printing system 1.
Figure 2:
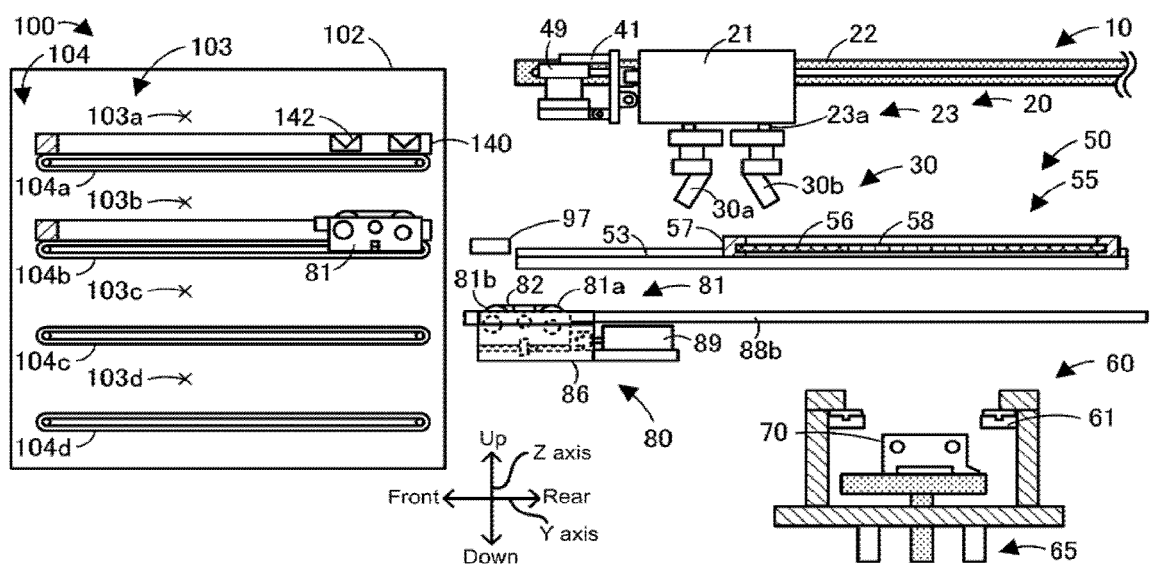
FIG. 2 is a cross section of printing apparatus 10 and accommodation apparatus 100.
Figure 3:
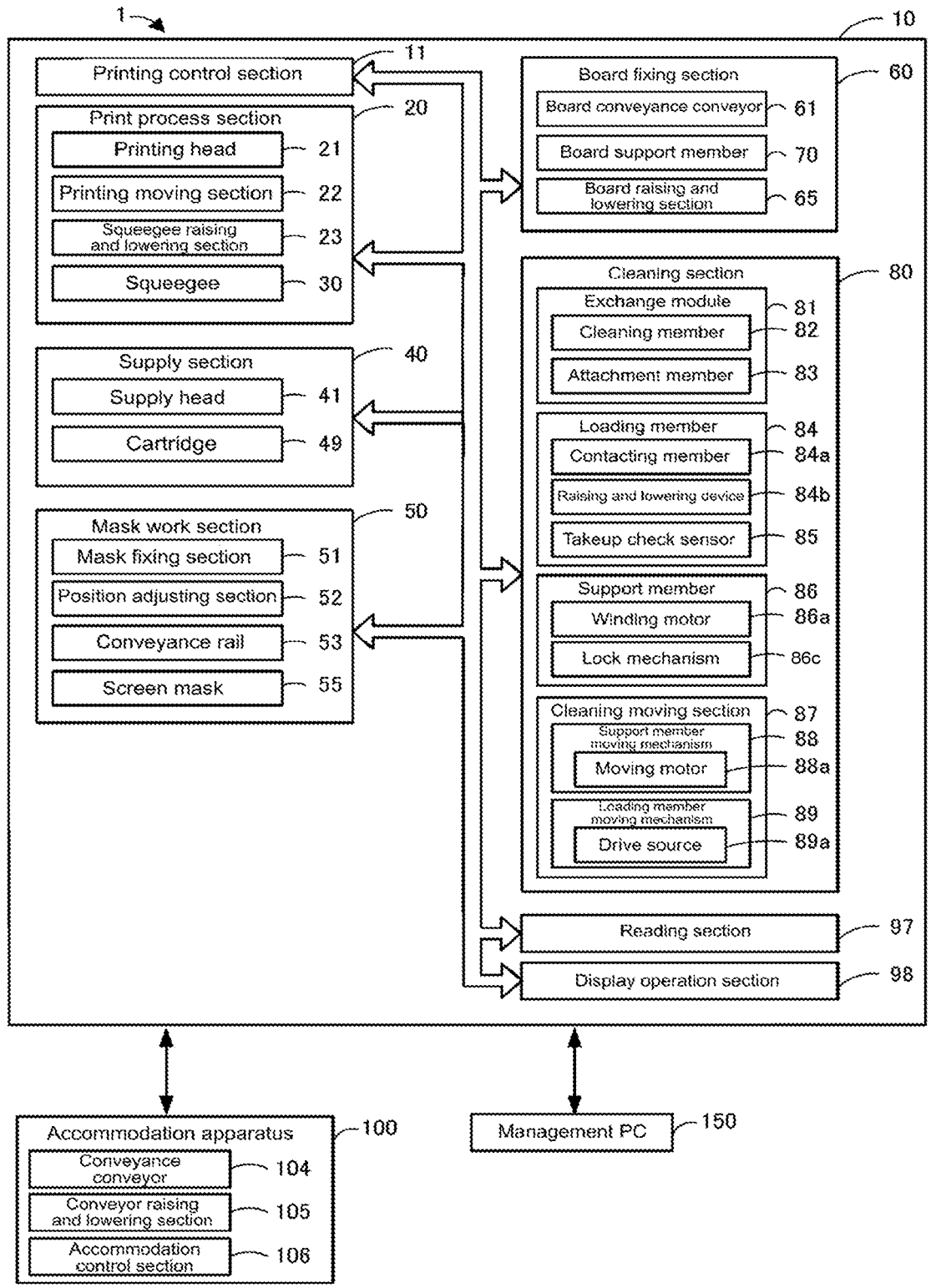
FIG. 3 is a block diagram showing electrical connections of printing system 1.
Figure 4:
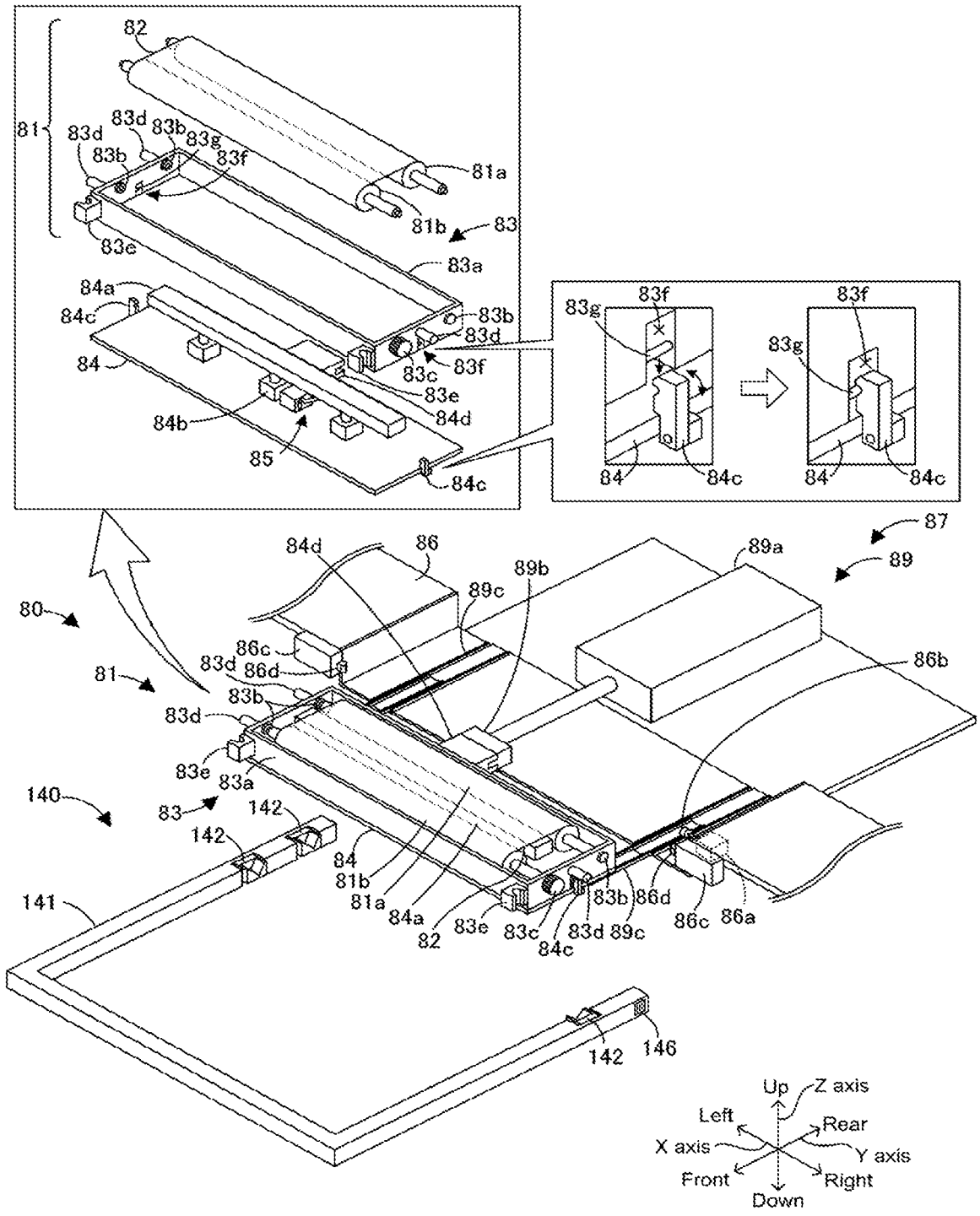
FIG. 4 is a perspective view of cleaning section 80 in a protruding state and cleaning member conveyance jig 140.
Figure 5:
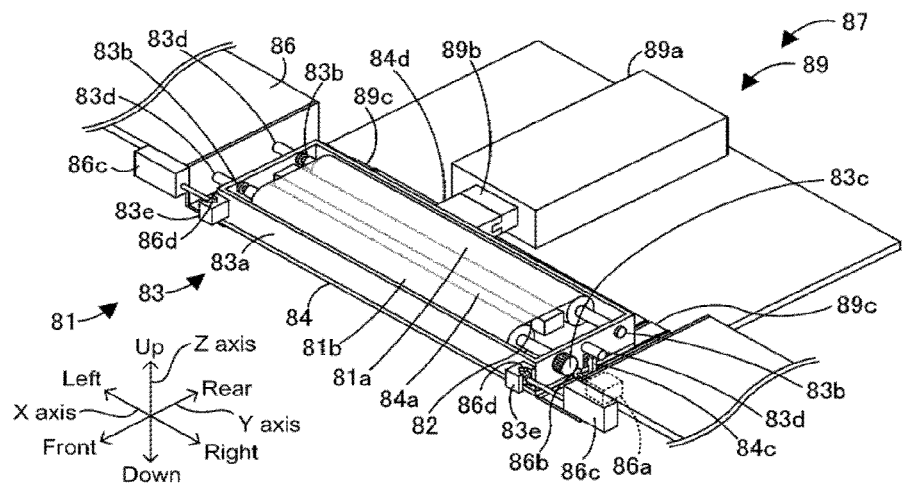
FIG. 5 is a perspective view of cleaning section 80 in a non-protruding state.
Figure 6:
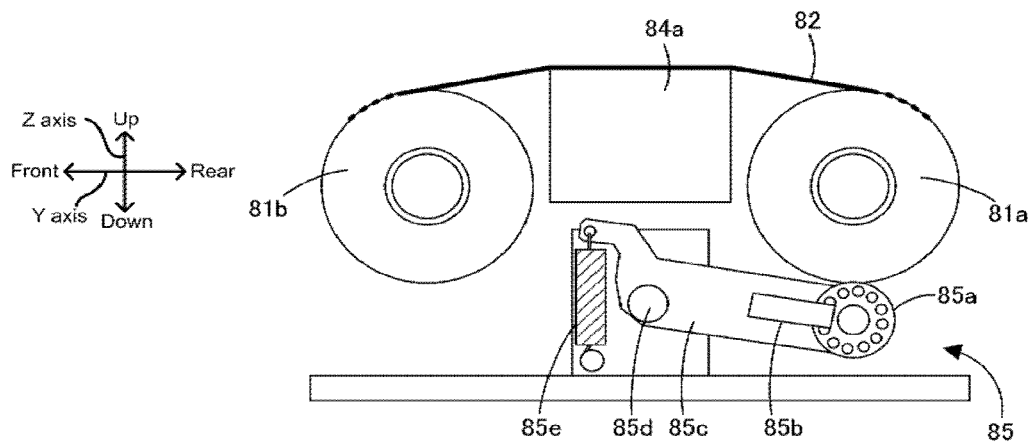
FIG. 6 is a configuration drawing of takeup check sensor 85.

Embodiments of the present disclosure are described below with reference to the figures. FIG. 1 shows an example of the overall configuration of printing system 1 as an embodiment of the present disclosure. FIG. 2 is a cross section of printing apparatus 10 and accommodation apparatus 100. FIG. 3 is a block diagram showing electrical connections of printing system 1. FIG. 4 is a perspective view of cleaning section 80 in a protruding state and cleaning member conveyance jig 140. FIG. 5 is a perspective view of cleaning section 80 in a non-protruding state. FIG. 6 is a configuration drawing of takeup check sensor 85. Printing system 1 is provided with printing apparatus 10 that performs printing of solder paste (also referred to as simply solder) as a viscous fluid onto a print target (here, board S) using screen mask 55. Printing system 1 is also provided with accommodation apparatus 100 that accommodates exchange-use cleaning member 82 used in printing apparatus 10, and management computer (PC) 150 that performs management of information related to processing of printing apparatus 10. Note that, printing system 1 may be configured as a mounting system also provided with other board work devices such as component mounters, not shown, that mounting electronic components on board S. Besides solder, other examples of a viscous fluid include conductive paste and adhesive. Printing apparatus 10 is configured as an apparatus capable of automatically exchanging cleaning member 82 used in printing. Also, exchange processing of cleaning member 82 is performed using cleaning member conveyance jig 140 shown in FIGS. 2 and 4. In the present embodiment, left-right directions (X axis), front-rear directions (Y axis), and up-down directions (Z axis) are set as shown in FIGS. 1 and 2.

Printing apparatus 10, as shown in FIGS. 1 and 2, performs application (printing) of solder onto board S through hole pattern 58 formed in screen mask 55 by using squeegee 30 to squeeze solder loaded on screen mask 55 through the hole pattern 58. Printing apparatus 10 is provided with printing control section 11 (an example of an exchange control section, shown in FIG. 3), print process section 20, supply section 40, mask work section 50, board fixing section 60, cleaning section 80, and reading section 97. Also, printing apparatus 10 is provided with display operation section 98 (FIG. 3) configured as an operation panel that displays items on a display screen and receives various inputs from an operator, and a communication section, not shown, that performs communication with other connected devices.

Printing control section 11 is configured from a microprocessor based around a CPU, and is provided with ROM that memorizes a processing program, RAM used as working memory, an HDD that memorizes various data, and so on. Printing control section 11 performs overall control of printing apparatus 10.

Print process section 20 is provided on an upper level of printing apparatus 10 and is a unit for performing a process of printing a viscous fluid on board S using screen mask 55. As shown in FIG. 3, print process section 20 is provided with printing head 21, printing moving section 22, squeegee raising and lowering section 23, squeegee 30, and a conveyance rod (not shown). Printing moving section 22 is for moving printing head 21 in a specified direction (here, a front-rear direction) and is provided with a guide formed in the front-rear direction, a slider that moves along the guide, and a motor that drives the slider. Squeegee raising and lowering section 23 is configured as an air cylinder including piston rod 23*a* (FIG. 2), and raises and lowers squeegee 30 by raising and lowering piston rod 23*a*. Print process section 20 includes two squeegees 30, first and second squeegees 30*a* and 30*b*, and correspondingly includes two piston rods 23*a*.

Supply section 40 is provided with supply head 41 and cartridge 49 in which solder is housed. Supply head 41 supplies pressure to cartridge 49 by, for example, air, such that solder is ejected from a nozzle, not shown, on the lower surface of cartridge 49. Supply section 40 is attached to printing head 21 and is moved to the front and rear by printing moving section 22.

Mask work section 50 is a unit for fixing and holding screen mask 55 and is provided between print process section 20 and board fixing section 60 in a vertical direction as shown in FIG. 2. As shown in FIG. 3, mask work section 50 is provided with mask fixing section 51, position adjusting section 52, and conveyance rail 53. Mask fixing section 51 is for positioning screen mask 55 and holding and fixing it in a horizontal posture. Position adjusting section 52 is for adjusting the position of mask fixing section 51 in the XY direction such that hole pattern 58 of screen mask 55 is arranged at a correct position with respect to the board S fixed by board fixing section 60. Conveyance rail 53 is a pair of left and right rails extending in the front-rear direction, and acts to guide screen mask 55 pushed by the conveyance rod as it moves in the front-rear direction. Screen mask 55 is provided with mask main body 56 in which hole pattern 58 of a specified wiring pattern or the like is formed, and frame 57 that supports mask main body 56 at a specified tension. Mask main body 56 is, for example, a thin metal plate. An identification section (for example, a mark) for position identification is formed on the lower surface of screen mask 55. A barcode, not shown, representing identification information of screen mask 55 is provided near the rear end on the right side of screen mask 55. The barcode, for example, is read in advance by an operator.

As shown in FIG. 2, board fixing section 60 is provided below mask work section 50, and is a unit for loading board S, positioning and supporting the loaded board S, and moving the board S towards and away from screen mask 55. Board fixing section 60 is provided with board conveyance conveyor 61 that conveys boards S in the left-right, board support member 70 that supports board S from below, and board raising and lowering section 65 that raises and lowers board fixing section 60 overall and board support member 70.

Cleaning section 80 is a unit for performing cleaning processing for cleaning a lower surface of screen mask 55 and is provided between mask work section 50 and board fixing section 60 in a vertical direction as shown in FIG. 2. As shown in FIGS. 4 and 5, cleaning section 80 is provided with exchange module 81 including cleaning member 82 capable of exchanging cleaning member 82 to and from accommodation apparatus 100, loading member 84 on which exchange module 81 is loaded, support member 86 that supports exchange module 81 and loading member 84, and cleaning moving section 87 that moves exchange module 81 and loading member 84. Note that, FIG. 4 also shows cleaning member conveyance jig 140 used in automatic exchange of exchange module 81 by printing apparatus 10. Also, cleaning moving section 87 is able to switch to and from a protruding state in which exchange module 81 and loading member 84 are protruding forward, and a non-protruding state in which they are not protruding. FIG. 4 shows the protruding state and FIG. 5 shows the non-protruding state.

Exchange module 81 is provided with first roller 81*a*, second roller 81*b*, cleaning member 82, and attachment member 83. Cleaning member 82 is a member for cleaning screen mask 55 and in the present embodiment is a wiping sheet that cleans screen mask 55 by being wiped against it. Cleaning member 82 is wound on first roller 81*a*. Second roller 81*b* is arranged forward to first roller 81*a* and takes up cleaning member 82 from first roller 81*a*. The portion of cleaning member 82 between first roller 81*a* and second roller 81*b* is used to clean screen mask 55.

Attachment member 83 is for attaching first and second rollers 81*a* and 81*b* and cleaning member 82. Attachment member 83 includes case body 83*a* that is a box-shaped member open at the top and bottom. Two pairs, that is, a total of four, shaft receivers 83*b* are provided opposite on the left and right inside sides of case body 83*a*. The shaft ends of first and second rollers 81*a* and 81*b* can be inserted into the pairs of shaft receivers 83*b* such that shaft receivers 83*b* rotatably support first and second rollers 81*a* and 81*b*. Shaft receiver 83*b* on the front right, which is not shown, is coaxially connected to gear 83*c* provided on the outside of case body 83*a*, such that second roller 81*b* and gear 83*c* rotate together. Gear 83*c* is arranged so as to engage with gear 86*b* of winding motor 86*a* in a non-protruding state, such that second roller 81*b* rotates to take up cleaning member 82 due to the driving force from winding motor 86*a*. Also, case body 83*a* includes protruding sections 83*d* that each protrude from attachment members 83 in the left and right directions. In the present embodiment, one protruding section 83*d* is provided on the right side of case body 83*a*, and two protruding sections 83*d* are provided on the left side of case body 83*a*. The multiple protruding sections 83*d* act as engaging sections that engage with protrusion holding sections 142 of cleaning member conveyance jig 140 shown in FIG. 4. Receiving members 83*e* are provided on the left and rights ends on the front surface of case body 83*a*. Receiving member 83*e* includes a recess open towards the outside on the right or left, and is configured to engage with lock member 86*d* of lock mechanism 86*c* in a non-protruding state. Opening sections 83*f* are formed on the left and right sides of case body 83*a* and engaging shafts 83*g* that extend in the Y direction are arranged inside opening sections 83*f*. Engaging shafts 83*g* are configured to engage with claw members 84c of loading members 84 (refer to the enlarged portion at the top right of FIG. 4).

Loading member 84 is configured as a plate member on which exchange module 81 is loaded and that supports exchange module 81 from below. Loading member 84 and attachment member 83 act as a cleaning head and are moved to the front and rear by cleaning moving section 87. Arranged on the upper surface of loading member 84 are contacting member 84a, raising and lowering device 84b, claw member 84c, connecting section 84d, and takeup check sensor 85. Contacting member 84a supports cleaning member 82 from below. Raising and lowering device 84b is configured from, for example, an air cylinder, and raises and lower contacting member 84a while supporting it from below. In a state with contacting member 84a raised by raising and lowering device 84b, by contacting member 84a raising up cleaning member 82, the upper surface of cleaning member 82 contacts the lower surface of screen mask 55. In this state, by cleaning moving section 87 moving loading member 84, cleaning section 80 performs cleaning operation by cleaning member 82 wiping off solder from the lower surface of screen mask 55. Claw member 84c is for preventing exchange module 81 falling from loading member 84 when loading member 84 is moving in the Y direction, a one claw member 84c each is provided on the left and right of loading member 84. Claw member 84c is roughly rectangular block with a lengthwise direction in the vertical direction. Claw member 84c includes an inclined surface on the upper end on the inside in the left-right direction (inside of attachment member 83), and a recess that engages with engaging shaft 83g of attachment member 83 is formed on the lower surface of the inclined surface. Claw member 84c is provided near the lower end and is rotatably supported around a rotation shaft along the Y direction, and is biased by a biasing member such as a spring, which is not shown, such that the upper end of claw member 84c is rotated to the inside in the left-right direction. Thus, when exchange module 81 is lowered from above loading member 84, engaging shaft 83g of attachment member 83 of exchange module 81 is guided by the inclined surface of claw member 84c, engages with the recess of claw member 84c, such that relative movement in the Y direction between attachment member 83 and loading member 84 is regulated. Note that, the biasing force of the biasing member biasing claw member 84c is adjusted such that, when exchange module 81 is attempted to be moved up from loading member 84, the engagement of engaging shaft 83g and claw member 84c is released. Connecting section 84d is for connecting to connecting section 89b of loading member moving mechanism 89, and is arranged on the rear side of loading member 84.

Takeup check sensor 85, by detecting whether first roller 81a has rotated, detects an exchange timing at which it is taken that cleaning member 82 (here, wiping sheet) has run out. As shown in FIG. 6, takeup check sensor 85 is provided with sensor dog 85a, photosensor 85b, rotation arm 85c, rotation shaft 85d, and spring 85e. Sensor dog 85a is a disc-shaped member and a center shaft thereof is fixed to the rear end of rotation arm 85c in a rotatable manner. Sensor dog 85a has multiple holes arranged in a ring around the center shaft. Photosensor 85b is provided with a pair of a light emitting section and a light receiving section arranged to the front and rear of sensor dog 85a. With photosensor 85b, whether the light receiving section detects light from the light emitting section depends on whether a hole of sensor dog 85a is opposite the light emitting section. Therefore, as sensor dog 85a rotates, the light receiving section repeatedly changes to and from a state detecting light from the light emitting section and a state not detecting light from the light emitting section. Rotation arm 85c is a flat plate member and is rotatably supported around rotation shaft 85d. Further, the rear end of rotation arm 85c is biased down by spring 85e such that the elastic force of spring 85e causes rotation arm 85c to bias sensor dog 85a up. Thus, sensor dog 85a pushes against the lower surface of first roller 81a so as to rotate with the rotation of first roller 81a. While cleaning member 82 is wound on both first and second rollers 81a and 81b, the driving force of winding motor 86a rotates first roller 81b and sensor dog 85a, with the light receiving section of photosensor 85b switching to and from a state detecting light from the light emitting section and a state not detecting light from the light emitting section. However, when cleaning processing is performed such that all the cleaning member 82 has been taken up onto second roller 81b, first roller 81a stops rotating even though winding motor 86a is still running, therefore the light receiving section of photosensor 85b is in only one of either the state detecting light from the light emitting section or the state not detecting light from the light emitting section. Takeup check sensor 85 outputs a signal indicating whether the light receiving section of photosensor 85b is detecting light to printing control section 11. Based on this signal, printing control section 11 is able to detect whether first roller 81a is rotating while winding motor 86a is running. Thus, if first roller 81a is not rotating when winding motor 86a is running, printing control section 11 determines that the sheet has run out and that it is the exchange timing for cleaning member 82.

As shown in FIG. 1, support member 86 is a plate supported by guide rails 88b on the left and right edges. Thus, support member 86 supports loading member 84 in a horizontal direction from the left and right. Winding motor 86a and lock mechanism 86c are arranged on support member 86. Winding motor 86a is arranged on support member 86 on the right side of attachment member 83, and is configured to rotate gear 83c and second roller 81b via gear 86b. Cleaning section 80, for example, by winding motor 86a rotating second roller 81b for a specified time after cleaning processing, performs sheet feeding processing of taking up the portion of cleaning member 82 used in cleaning, that is, the portion with solder on, onto second roller 81b. Lock mechanism 86c, for example, is configured from an air cylinder, and is a mechanism for using the cylinder to make lock member 86 protrude in the X direction. One lock mechanism 86c each is arranged on support member 86 on the left and right sides of attachment member 83. As shown in FIG. 5, when lock mechanism 86c makes lock member 86d protrude to the attachment member 83 side with exchange module 81 and loading member 84 in a non-protruding state, lock member 86d is inserted into and engages with the recess of receiving member 83e of attachment member 83. Accordingly, relative movement in the Y direction with respect to support member 86 of exchange module 81 and loading member 84 is regulated, and they are fixed in the non-protruding state. On the other hand, as shown in FIG. 4, in a state in which lock mechanism 86c is not making lock member 86d protrude, it is possible to switch exchange module 81 and loading module 84 to and from a protruding state and a non-protruding state using loading member moving mechanism 89.

Cleaning moving section 87 is provided with support member moving mechanism 88 and loading member moving mechanism 89. As shown in FIG. 1, support member moving mechanism 88 includes Y-axis slider 88a and pair of left and right guide rails 88b extending in the front-rear direction. Y-axis slider 88*a* is arranged on support member 86 and support member 86 is moved in the Y direction by Y-axis slider 88*a* being moved along guide rails 88*b*. Support member moving mechanism 88 also moves exchange module 81 and loading member 84 in the Y direction by moving support member 86 in the Y direction. As shown in FIGS. 4 and 5, loading member moving mechanism 89 is provided with drive source 89*a* configured as, for example, an air cylinder, and connecting section 89*b* connected to connecting section 84*d* of loading member 84 and arranged at the end of the cylinder rod of drive source 89*a*. Also, loading member moving mechanism 89 is provided with expansion rail 89*c* that is arranged on support member 86 and provided with multiple rails that slide in the Y direction. When driving power in the Y direction is applied by drive source 89*a* via connecting section 89*b* and connecting section 84*d*, expansion rails 89*c* are extended or retracted, such that loading member 84 is moved in the Y direction relative to support member 86. Thus, loading member moving mechanism 89 is able to switch exchange module 81 and loading member 84 to and from a protruding state protruding relatively with respect to support member 86 (FIG. 4), and a non-protruding state not protruding relatively with respect to support member 86 (FIG. 5). Cleaning moving section 87, by support member moving mechanism 88 and loading member moving mechanism 89, is able to move cleaning member 82 to and from a cleaning position at which cleaning of screen mask 55 is performed by cleaning member 82, and an exchange position at which cleaning member 82 is exchanged with cleaning member conveyance jig 140. Note that, the cleaning position, for example, is directly under screen mask 55 fixed by mask fixing section 51. The exchange position is a position at which transfer at exchange module 81 is performed between, for example, cleaning member conveyance jig 140 and cleaning section 80. Also, cleaning moving section 87 performs loading of cleaning member 82 and exchange module 81 including cleaning member 82.

Cleaning member conveyance jig 140 shown in FIG. 4 acts a holder to which exchange module 81 is attached. Cleaning member conveyance jig 140 is provided with frame 141 that is open on the rear side, protrusion holding sections 142 provided on the left and right sides on the inside of frame 141, and barcode 146 provided near the rear end at the right side of frame 141. A quantity of protrusion holding sections 142 is provided corresponding to the protruding sections 83 of attachment member 83 (in this case, three). More specifically, there is one protrusion holding section 142 on the right, and two protrusion holding sections 142 on the left. Protrusion holding section 142 has a recess formed in an upper surface thereof, and protrusion holding section 142 engages with protruding section 83*d* loaded in this recess to support protruding section 83*d* from below. By protruding section 83*d* engaging with this recess, relative movement of exchange module 81 in the front-rear direction of cleaning member conveyance jig 140 is fixed while allowing conveyance of exchange module 81. Barcode 146 is identification information for identifying the cleaning member 82 attached to cleaning member conveyance jig 140, and is read in advance by an operator, for example.

Reading section 97 is for reading information related to exchange module 81 including exchange-use cleaning member 82 accommodated in accommodation apparatus 100 and in the present embodiment is configured from a barcode reader. As shown in FIG. 1, reading section 97 is provided on the right side inside printing apparatus 10, and the left direction is the reading direction. Reading section 97 is arranged at a height the same as the height at which screen mask 55 is loaded and unloaded (loading height and unloading height), such that a barcode provided near the front end on the right side of screen mask 55 can be read. Also, reading section 97 is able to read barcode 146 so long as cleaning member conveyance jig 140 is conveyed at the same height.

Accommodation apparatus 100 is arranged at the front of printing apparatus 10, and accommodates exchange-use exchange module 81, and performs loading and unloading of exchange module 81 to and from printing apparatus 10. Accommodation apparatus 100 is provided with housing 101, accommodation section 102, conveyance conveyor 104, conveyor raising and lowering section 105, and accommodation control section 106. Housing 101 is roughly a cuboid box and includes accommodation section 102 on the inside. Moving sections such as casters are provided on the lower surface of housing 101 such that, for example, accommodation apparatus 100 can be moved by an operator. Accommodation section 102 is a box capable of accommodating exchange-use exchange module 81 and cleaning member conveyance jig 140, and is provided with multiple conveyance conveyors 104 inside thereof. Conveyance conveyors 104 are provided at multiple levels in the vertical direction, and in the present embodiment, as shown in FIG. 2, there are four conveyance conveyors 104*a* to 104*d* arranged in order from a first to a fourth. Each of the first to fourth conveyance conveyors 104*a* to 104*d* is configured with a pair of left and right belt conveyors, so as to convey a loaded item in the front-rear direction. Accommodation section 102 is configured to be able to load at least one exchange module 81 in each of the first to fourth conveyance conveyors 104*a* to 104*d*. Accommodation section 102 includes multiple levels of accommodation regions 103 in the vertical direction divided according to first to fourth conveyance conveyors 104*a* to 104*d*. Accommodation region 103 includes first accommodation region 103*a* as a region above first conveyance conveyor 104*a*, and similarly includes second to fourth accommodation regions 103*b* to 103*d* respectively above second to ninth conveyance conveyors 104*b* to 104*d*. Accommodation section 102 is open at the front and rear. Thus, an operator is able to insert exchange modules 81 into accommodation section 102 from the front, and accommodation apparatus 100 is able to load and unload exchange modules 81 to and from printing apparatus 10 via the rear of accommodation section 102. Conveyor raising and lowering section 105 is configured to raise and lower accommodation section in a vertical direction and is provided with, for example, a guide, a ball screw, and a driving motor, which are not shown. By conveyor raising and lowering section 105 raising or lowering accommodation section 102, conveyance conveyor 104 is raised or lowered. Note that, cleaning member conveyance jig 140, for example, may be roughly the same width in the left-right direction as screen mask 55. Thus, accommodation apparatus 100 is able to load not only cleaning member conveyance jig 140 in the multiple conveyance conveyors 104, but also screen mask 55.

Accommodation control section 106 is configured from a microprocessor based around a CPU, and is provided with ROM that memorizes a processing program, RAM used as working memory, an HDD that memorizes various data, and so on. Accommodation control section 106 performs overall control of accommodation apparatus 100.

Figure 7:
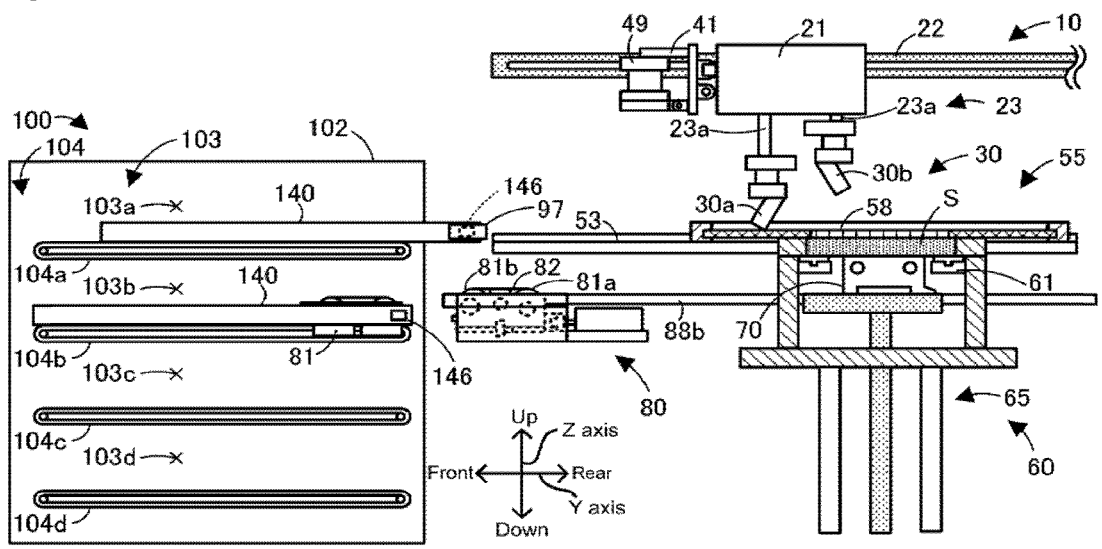
FIG. 7 illustrates a printing process and a reading process being performed in parallel.
Figure 8:
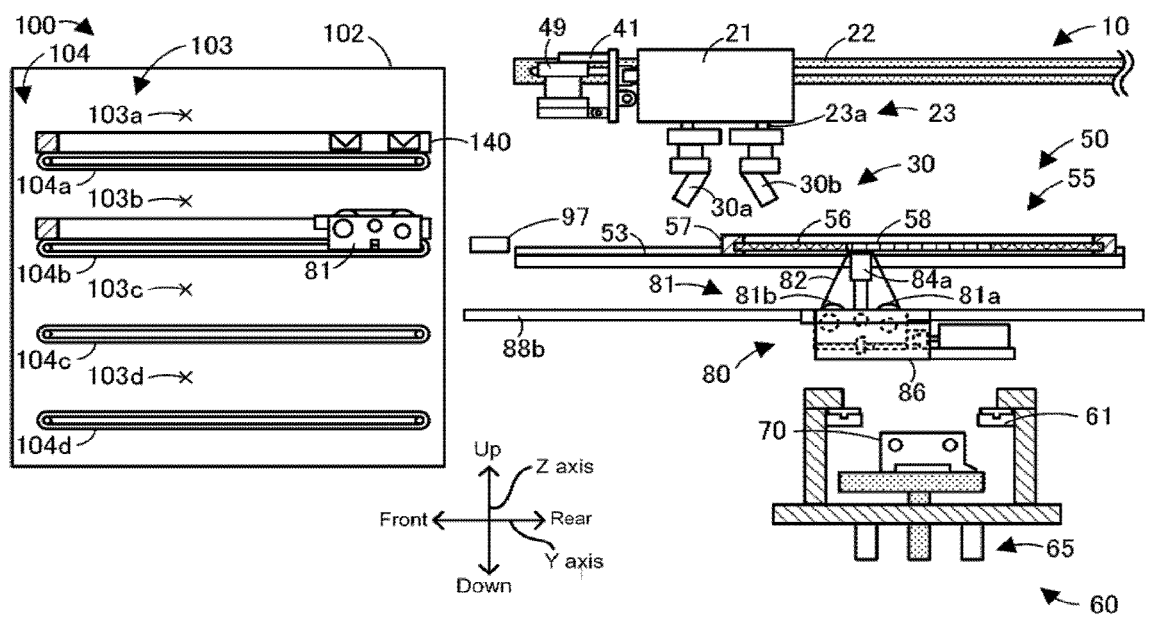
FIG. 8 illustrates a state during cleaning processing.

Operation of the above printing system 1 is described next. First, descriptions are given with regard to printing processing performed by printing apparatus 10, cleaning processing that is performed during printing processing, and reading processing for reading identification information of cleaning members 82 accommodated in accommodation apparatus 100 that is performed in parallel with printing processing. FIG. 7 illustrates a printing process and a reading process being performed in parallel. FIG. 8 illustrates a state during cleaning processing.

First, printing processing is described. The printing processing routine for performing printing processing is memorized on the HDD of printing control section 11, and is performed by printing control section 11 after instructions to perform printing processing are entered by an operator via display operation section 98, or is performed by printing control section 11 after instructions to perform printing processing are issued by management PC 150. When the printing processing routine is started, printing control section 11, first, as shown in FIG. 7, performs board conveyance and fixing processing to fix board S using board fixing section 60 such that board S contacts screen mask 55. Here, printing control section 11 adjusts the position of screen mask 55 as necessary using mask work section 50 and aligns the positions of hole pattern 58 and board S. Upon board conveyance and fixing processing being performed, printing control section 11 performs solder supply processing. Specifically, printing control section 11 moves supply head 41 above screen mask 55, and emits solder from cartridge 49 onto screen mask 55. Upon solder supply processing being performed, printing control section 11 performs squeegee moving processing. Specifically, printing control section 11 moves printing head 21, lowers squeegee 30 (first squeegee 30a in FIG. 7) such that squeegee 30 contacts the upper surface of screen mask 55 and moves squeegee 30 in the front-rear direction such that solder is printed onto the board S. Printing control section 11 performs at least one of processing to move first squeegee 30a in the rear direction on screen mask 55, and processing to move second squeegee 30b in the front direction. In this manner, printing control section 11 performs printing processing that includes board conveyance and fixing processing, solder supply processing, and squeegee moving processing, so as to perform printing onto board S. Printing control section 11 repeatedly performs printing processing until production processing is complete.

Also, printing control section 11 performs the above cleaning processing and sheet feeding processing during printing processing. Printing control section 11, for example, performs cleaning processing and sheet feeding processing at a specified timing such as periodically at a specified time interval, or every time printing processing on multiple boards S has been performed a specified quantity of times. Printing control section 11, for example, determines whether it is time to perform cleaning when printing is started, and if it is time to perform cleaning, first, performs cleaning processing and sheet feeding processing and then performs board conveyance and fixing processing. Specifically, when it is time to perform cleaning, printing control section 11, first, controls cleaning moving section 87 such that cleaning member 82 is moved to the cleaning start position below screen mask 55 (for example, directly below the front end of screen mask 55). Continuing, printing control section 11 raises contacting member 84a such that the upper surface of cleaning member 82 contacts the underside of screen mask 55. Next, printing control section 11, in that state, performs cleaning processing by moving cleaning member in the front-rear direction (for example, to the rear) to the cleaning finish position (for example, directly below the rear center section of screen mask 55) (FIG. 8). By this, the portion of cleaning member 82 fed from first roller 81a, that is, the portion existing between first roller 81a and second roller 81b, wipes off solder affixed to the underside of screen mask 55 across the entire lower surface, thereby removing solder from the underside of screen mask 55. When cleaning processing is complete, printing control section 11 lowers contacting member 84a and moves exchange module 81 back to its initial position. The initial position may be a position at the front end of a region at which exchange module 81 can be moved by support member moving mechanism 88. Also, printing control section 11 performs sheet feeding processing of using winding motor 86a to rotate second roller 81b such that the portion of cleaning member 82 used for cleaning processing, that is, the portion with solder on it, is wound onto (in the present embodiment, taken up by) second roller 81b. Note that, the cleaning position corresponds to a position from the above cleaning start position to the cleaning finish position.

Note that, while printing apparatus 10 is performing this printing processing, an operator may, in a case in which exchange of cleaning member 82 is required due to, for example, running out of cleaning member 82, accommodate in advance in accommodation apparatus 100 at least one cleaning member conveyance jig 140 to which is attached an exchange module 81 including an exchange-use cleaning member 82. Also, an operator may accommodate in accommodation apparatus 100 at least one empty cleaning member conveyance jig 140 required for unloading from printing apparatus 10 the exchange module 81 currently in use. In FIG. 2, an empty cleaning member conveyance jig 140 is accommodated in first accommodation region 103a, and a cleaning member conveyance jig 140 to which is attached an exchange module 81 including an exchange-use cleaning member 82 of the same type as the cleaning member 82 currently in use is accommodated in second accommodation region 103b. Third and fourth accommodation regions 103c and 103d are empty. An operator, while printing apparatus 10 is performing printing processing and it is not time to exchange cleaning member 82, may load in advance an exchange-use cleaning member 82 to accommodation apparatus 100. Accordingly, the operator is able to perform work for exchange-use cleaning member 82 during a period in which their workload is light.

Note that, the operator may attach in advance to each cleaning member conveyance jig 140 a barcode indicating the identification information of the cleaning member 82 attached to that conveyance jig. For example, the operator may include information representing the type of cleaning member 82 attached to the cleaning member conveyance jig 140 in the barcode 146 affixed to that cleaning member conveyance jig 140. Note that, information representing a state of the cleaning member conveyance jig 140 may also be included in the barcode 146. For example, information representing whether the cleaning member conveyance jig 140 is empty, that is, information representing whether an exchange-use cleaning member 82 is attached to the protrusion holding sections 142 of the cleaning member conveyance jig 140, may be included in barcode 146. Thus, printing control section 11, by using reading section 97 to read barcode 116 of cleaning member conveyance jig 140, is able to identify whether the cleaning member conveyance jig 140 is empty and identify the type of cleaning member 82 attached to the cleaning member conveyance jig 140.

Reading processing is described next. The reading processing routine for performing reading processing is memorized on the HDD of printing control section 11, and is performed, for example, at a specified time interval, or after an instruction to perform reading processing is entered by an operator. When the reading processing routine is started, printing control section 11 outputs an instruction to accommodation control section 106 of accommodation apparatus 100 to sequentially move cleaning member conveyance jig 140 accommodated in accommodation section 102 to a position at which reading is possible by reading section 97. Accommodation control section 106 that has received this instruction, first, performs raising or lowering of conveyor raising and lowering section 105 as required such that the height of reading section 97 and the height of the cleaning member conveyance jig 140 loaded on first conveyance conveyor 104a are the same. Next, accommodation control section 106 uses first conveyance conveyor 104a to move the cleaning member conveyance jig 140 to the rear to move barcode 146 to a position at which reading is possible by reading section 97 (FIG. 7). Then, accommodation control section 106 moves the cleaning member conveyance jig 140 to return it to its original position. Here, printing control section 11 uses reading section 97 to read barcode 146 and memorizes the acquired information on the HDD. Accommodation control section 106 performs similar processing sequentially for second conveyance conveyor 104b to fourth conveyance conveyor 104d. According to such reading processing, printing control section 11 acquires and memorizes information required for cleaning member exchange processing, which is described later, such as information of the types of cleaning member 82 accommodated in each of the accommodation regions 103 of accommodation apparatus 100, and information of in which of the multiple accommodation regions 103 empty cleaning member conveyance jigs 140 are accommodated. Also, printing control section 11 is able to identify empty accommodation regions 103 that do not accommodate a cleaning member conveyance jig 140 (in FIG. 7, these are third and fourth accommodation regions 103c and 103d) by, for example, detecting that a specified time has elapsed without reading section 97 having read information despite conveyance having been performed by conveyance conveyor 104. Note that, as shown in FIG. 7, reading section 97 is arranged at the front side of printing apparatus 10. Thus, even if a cleaning member conveyance jig 140 is moved from the accommodation apparatus 100 in front to the reading position of reading section 97, there is no impediment to operation of print process section 20, supply section 40, mask work section 50, board fixing section 60, and cleaning section 80 during the printing processing, which is described later. Accordingly, printing control section 11 can perform reading processing in parallel with printing processing. By this, printing control section 11 is able to acquire information of cleaning members 82 and cleaning member conveyance jigs 140 accommodated in accommodation apparatus 100 without stopping printing processing.

Note that, with regard to operation on the accommodation apparatus 100 side during reading processing, an operation routine for during reading processing may be memorized in advance on the memory section of accommodation control section 106, and printing control section 11 may issue just a starting instruction for the operation routine. Alternatively, printing control section 11 may sequentially output an individual operation command for conveyor raising and lowering section 105 and conveyance conveyor 104 to accommodation control section 106.

Described next is cleaning member exchange processing for performing automatic exchange of cleaning members 82. The cleaning member exchange processing routine is memorized on the HDD of printing control section 11. Printing control section 11 determines whether cleaning member 82 has run out of sheet, that is, whether it is time to exchange cleaning member 82, based on, for example, a signal from takeup check sensor 85, and if it is time to perform exchange, starts the exchange processing routine. Printing control section 11, for example, when winding motor 86a is running during the above sheet feeding processing or the like, when a signal representing the fact that the light receiving section of photosensor 85b is in one of either a state detecting light or a state not detecting light is received from takeup check sensor 85, determines that it is time to perform exchange. Note that, printing control section 11, upon determining that it is time to perform exchange, may perform cleaning member exchange processing in parallel with printing processing. Note that, printing control section 11 performs the exchange processing routine while referencing as appropriate the information acquired during the reading processing described above.

Figure 9:
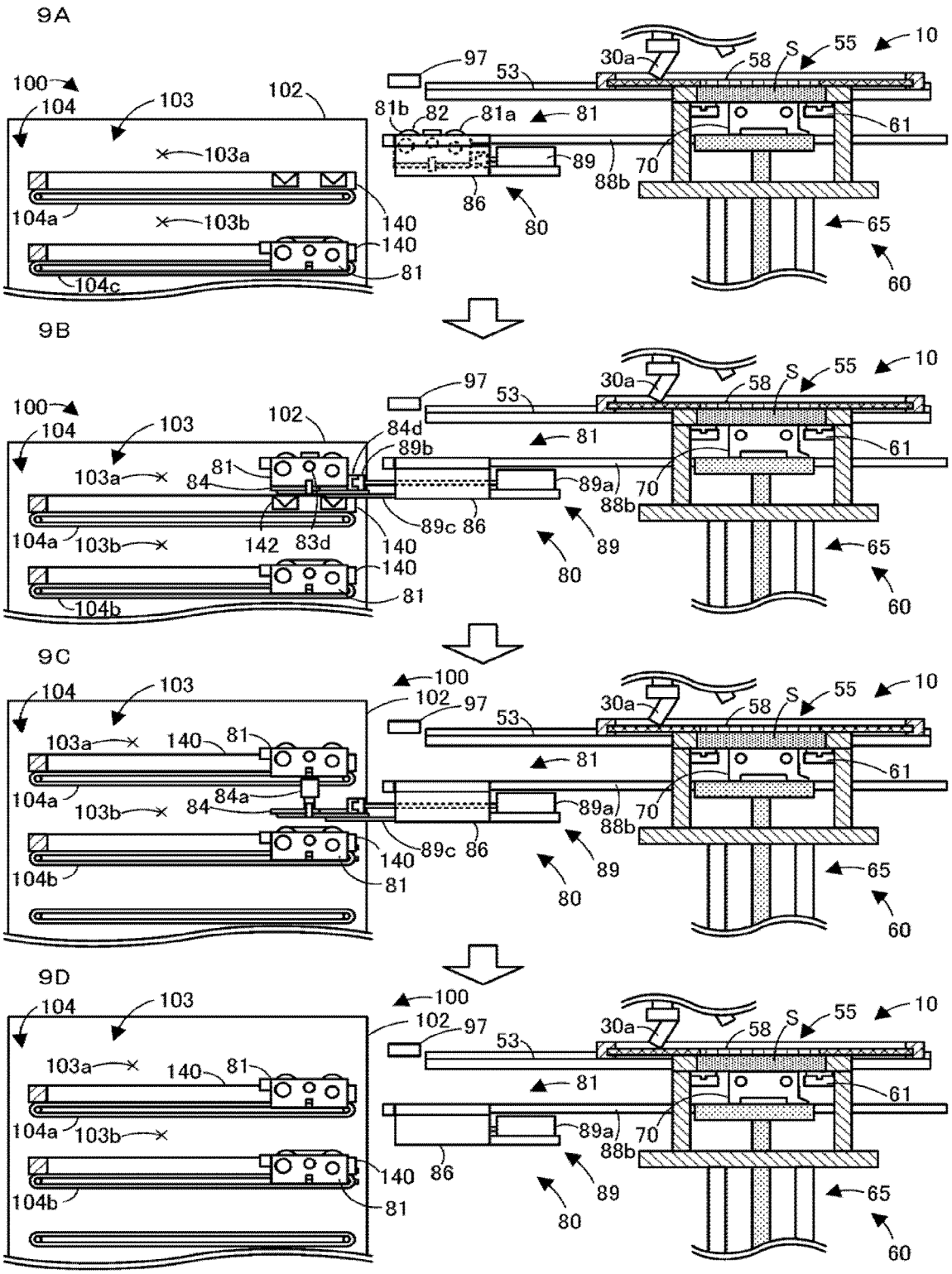
FIG. 9 illustrates a state when performing cleaning member unloading processing in parallel with printing.
Figure 10:
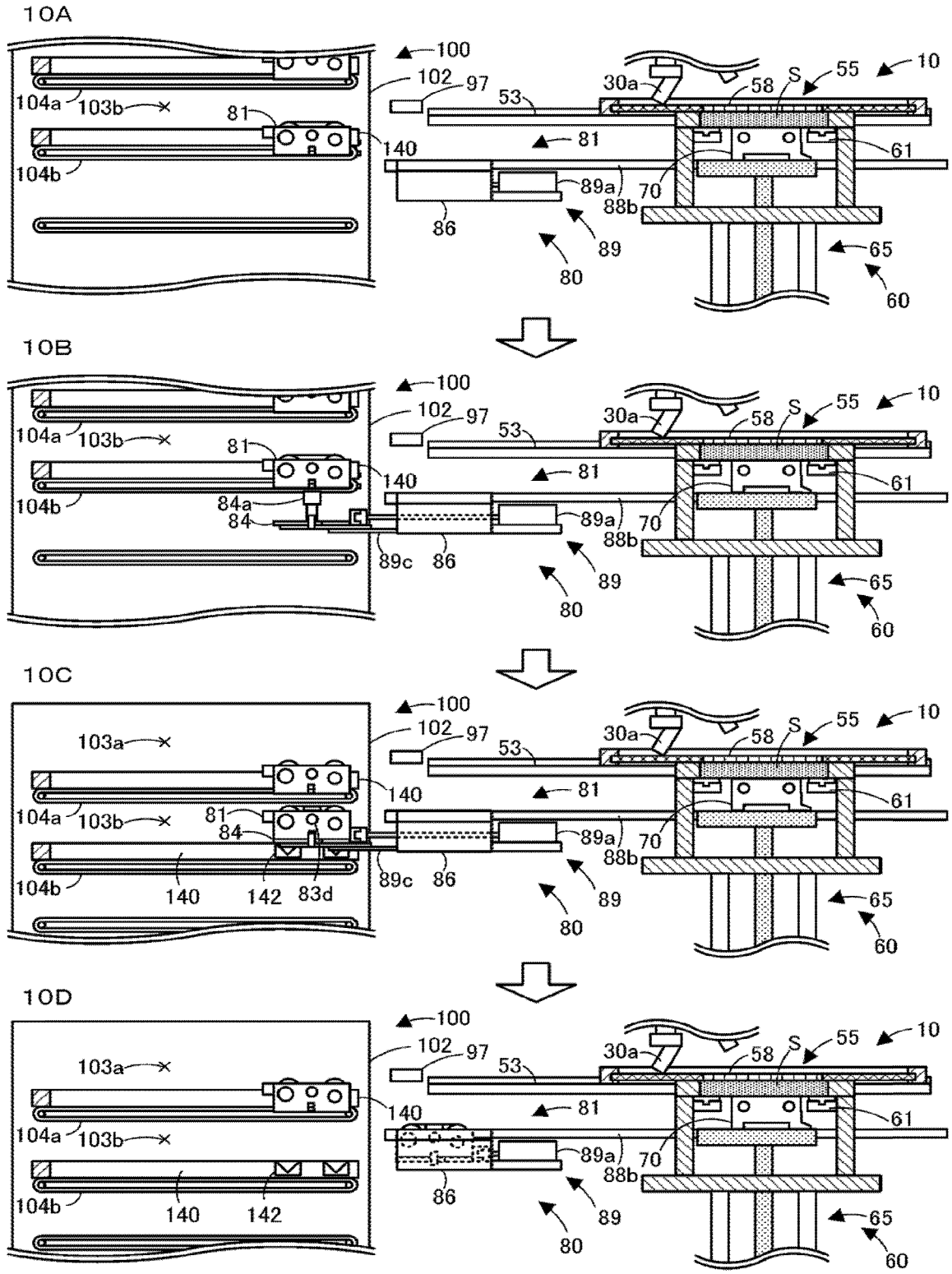
FIG. 10 illustrates a state when performing cleaning member loading processing in parallel with printing.

When cleaning member exchange processing is started, printing control section 11 performs cleaning member unloading processing of unloading exchange module 81, and cleaning member loading processing of loading exchange-use exchange module 81. FIG. 9 illustrates a state when performing cleaning member unloading processing in parallel with printing. FIG. 10 illustrates a state when performing cleaning member loading processing in parallel with printing. During cleaning member unloading processing, printing control section 11, first, operates conveyor raising and lowering section 105 (FIG. 9A) such that empty cleaning member conveyance jig 140 is positioned at the height for unloading exchange module 81 (unloading height). Here, printing control section 11 raises or lowers first conveyance conveyor 104a on which the empty cleaning member conveyance jig 140 is loaded to the unloading height. The exchange module 81 unloading height is a height at which protrusion holding sections 142 of cleaning member conveyance jig 140 below protruding sections 83d of exchange module 81 attached to loading member 84 are positioned. Further, printing control section 11 controls support member moving mechanism 88 such that exchange module 81 is moved in front of printing apparatus 10 (FIG. 9A). Note that, the position of exchange module 81 at this point may be, for example, a position at the front end of the region in which exchange module 81 can be moved by support member moving mechanism 88, or an initial position of exchange module 81. Next, printing control section 11, by controlling loading member moving mechanism 89 such that loading member 84 is in a protruding state, moves exchange module 81 to a transfer position at which exchange module 81 can be attached to cleaning member conveyance jig 140 (FIG. 9B). In the present embodiment the transfer position is inside accommodation section 102, and printing control section 11 performs operation of moving exchange module 81 to the transfer position and unloading operation of exchange module 81. In this state, the multiple protruding sections 83d of exchange module 81 are positioned directly above the multiple protrusion holding sections 142 of empty cleaning member conveyance jig 140. Continuing, printing control section 11 uses conveyor raising and lowering section 105 to raise accommodation section 102. Thus, protrusion holding sections 142 and protruding sections 83d engage, exchange module 81 is attached to cleaning member conveyance jig 140, is raised, and exchange module 81 is removed from loading member 84 (FIG. 9C). Thus, exchange module 81 is unloaded and transferred to cleaning member conveyance jig 140. Then, printing control section 11 moves loading member 84 to the non-protruding state (FIG. 9D).

During cleaning member loading processing, printing control section 11, first, operates conveyor raising and lowering section 105 (FIG. 10A) such that the exchange-use exchange module 81 on conveyance conveyor 104 (here, second conveyance conveyor 104b) is positioned higher than the height (refer to FIG. 9C) of the top end of loading member 84 (here, the top end of contacting member 84a) in a protruding state. Next, printing control section 11, by controlling loading member moving mechanism 89 such that loading member 84 is in a protruding state, moves loading member 84 to a receiving position at which exchange module 81 can be received from cleaning member conveyance jig 140 (FIG. 10B). At this receiving position, loading member 84 is positioned directly below exchange-use exchange module 81. Continuing, accommodation section 102 is lowered such that the cleaning member conveyance jig 140 on second conveyance conveyor 104b is positioned at a height for loading exchange module 81 (loading height), and is then lowered below the loading height (FIG. 10C). By this, exchange module 81 is attached to loading member 84, and cleaning member conveyance jig 140 is lowered further such that the engaging of protrusion holding sections 142 and protruding sections 83d is released. Note that, the exchange module 81 loading height is the height at which exchange-use exchange module 81 is lowered to when attached to loading member 84. Further, printing control section 11, by making loading member 84 into a non-protruding state, loads exchange module 81 inside printing apparatus 10 (FIG. 10D). Thus, exchange module 81 is removed from cleaning member conveyance jig 140 and loaded into printing apparatus 10. When the above cleaning member unloading processing and cleaning member loading processing have been performed, printing control section 11 ends cleaning member exchange processing.

Note that, as shown in FIGS. 9 and 10, cleaning member exchange processing is performed at the front side of printing apparatus 10. Therefore, cleaning member exchange processing, similar to reading processing, does not impede operation of print process section 20, supply section 40, mask operation section 50, and board fixing section 60 during the above-described printing processing. Thus, printing control section 11 is able to perform cleaning member exchange processing in parallel with printing processing.

Here, correspondences between constituent elements of printing apparatus 10 of the present embodiment and constituent elements of a printing apparatus of the disclosure are described next. Cleaning member 82 of the present embodiment corresponds to a "cleaning member" of a printing apparatus of the present disclosure; cleaning section 80 corresponds to a "cleaning section"; cleaning moving section 87 corresponds to a "cleaning member moving section"; and printing control section 11 corresponds to an "exchange control section". Further, cleaning member conveyance jig 140 corresponds to a "holder"; first roller 81a corresponds to a "feeding section"; second roller 81b corresponds to a "takeup section"; and takeup check sensor 85 and printing control section 11 correspond to a "detection section".

Printing apparatus 10 of the present disclosure described above is provided with cleaning moving section 87 configured to perform at least one (here, both) of moving cleaning member 82 to and from a cleaning position and an exchange position (transfer position and receiving position) of cleaning member 82, and unloading and loading of cleaning member 82. Further, printing control section 11 of printing apparatus 10 is configured to perform cleaning member exchange processing of exchanging cleaning member 82 using cleaning moving section 87. Thus, printing apparatus 10 is able to perform automatic exchange of cleaning member 82.

Also, printing control section 11, during cleaning member exchange processing, controls cleaning moving section 87 such that cleaning member 82 is exchanged together with attachment member 83 to and from cleaning member conveyance jig 140 and cleaning section 80. By this, with printing apparatus 10, when performing automatic transfer of cleaning member 82 to and from cleaning member conveyance jig 140, for example, even if cleaning member 82 is a shape difficult to attach directly to protrusion holding sections 142 of cleaning member conveyance jig 140, or if cleaning member 82 is in a state difficult to attach directly to cleaning section 80, by exchanging the entire attachment member 83 including protruding sections 83 that engage with protrusion holding sections 142, it is easy to perform automatic exchange of cleaning member 82.

Further, printing control section 11, during cleaning member exchange processing, controls loading member moving mechanism 89 of cleaning moving section 87 such that during transfer of attachment member 83 to and from cleaning member conveyance jig 140 loading member 84 is in a protruding state protruding to the cleaning member conveyance jig 140 side (here, the front side) in the front-rear direction with respect to support member 86. Thus, printing apparatus 10, in a case in which protruding sections 83d that protrude from the left and right sides of attachment member 83 and protrusion holding sections 142 are made to engage or release from each other, loading member 84 is made to protrude to the front with respect to support member 86, such that interference is unlikely to occur between cleaning member conveyance jig 140 and support member 86. Accordingly, printing apparatus 10 is able to easily perform automatic exchange of cleaning member 82.

Further, printing control section 11, during cleaning member exchange processing, by conveyor raising and lowering section 105 raising or lowering cleaning member conveyance jig 140, protruding sections 83d of attachment member 83 of cleaning section 80 engage with protrusion holding sections 142 of cleaning member conveyance jig 140 and attachment member 83 is attached to cleaning member conveyance jig 140. Also, printing control section 11, during cleaning member exchange processing, by conveyor raising and lowering section 105 raising or lowering cleaning member conveyance jig 140, protruding sections 83d of attachment member 83 attached to protrusion holding sections 142 are released from protrusion holding sections 142, and are attached to cleaning section 80. Accordingly, printing apparatus 10 is able to perform at least one of using conveyor raising and lowering section 105 of accommodation apparatus 100 to transfer attachment member 83 to cleaning member conveyance jig 140 or removal of attachment member 83 from cleaning member conveyance jig 140, so there is no need for printing apparatus 10 itself to be provided with a mechanism for performing this.

Further, cleaning member 82 is a wiping sheet for cleaning by being wiped on screen mask 55, and printing apparatus 10 is provided with takeup check sensor 85 for detecting an exchange timing at which it is taken that the wiping sheet has run out. Also, printing control section 11 performs cleaning member exchange processing when the exchange timing is detected based on a signal from takeup check sensor 85. Accordingly, printing apparatus 10 is able to automatically exchange the wiping sheet when exchange of the wiping sheet is required.

Further, printing control section 11 performs at least a portion of cleaning member exchange processing during printing. Accordingly, printing apparatus 10 is able to shorten the time for which printing is stopped in order to exchange cleaning member 82. In the present embodiment, all of cleaning member exchange processing may be performed during printing, in which case it is not necessary to stop printing in order to exchange cleaning member 82.

Meanwhile, it goes without saying that the disclosure is not limited to the above-mentioned embodiment and various embodiments may be applied within the technical scope of the disclosure.

For example, in an embodiment above, printing control section 11 exchanges cleaning member 82 by exchanging it together with exchange module 81, but the configuration is not limited to this. For example, printing control section 11 may perform automatic exchange of only cleaning member 82 or first or second roller 81a or 81b. In this case, the first and second roller 81a and 81b correspond to the "attachment member". Also, printing apparatus 10 may perform at least automatic exchange of cleaning member 82.

In an embodiment above, printing control section 11, during cleaning member exchange processing, when using loading member moving mechanism 89 to transfer exchange module 81 to and from cleaning member conveyance jig 140, makes loading member 84 protrude to the front with respect to support member 86, but the configuration is not limited to this. Printing apparatus 10 may transfer exchange module 81 to and from accommodation apparatus 100. For example, when engaging or releasing protruding sections 83d and protrusions holding sections 142, the shape of support member 86 may be different to an embodiment above in order to prevent interference between cleaning member conveyance jig 140 and support member 86. Alternatively, printing apparatus 10 may include a raising and lowering section for raising or lowering exchange module 81 with respect to support member 86, thereby preventing interference between cleaning member conveyance jig 140 and support member 86.

In an embodiment above, during cleaning member exchange processing, printing control section 11 makes exchange module 81 protrude inside accommodation section 102, but the configuration is not limited to this. In other words, printing control section 11 performs loading and unloading of exchange module 81, but the configuration is not limited to this. For example, accommodation apparatus 100 may use conveyance conveyor 104 to convey at least a portion of cleaning member conveyance jig 140 inside printing apparatus 10, and printing control section 11 may perform cleaning member exchange processing to and from cleaning member conveyance jig 140.

In an embodiment above, attachment member 83 is provided with protruding sections 83d, but this is not required so long as there is an engaging section that can engage with and be released from engagement with cleaning member conveyance jig 140.

In an embodiment above, accommodation apparatus 100 transfers exchange module 81 to and from cleaning member conveyance jig 140 and loading member 84 by raising and lowering cleaning member conveyance jig 140, but the configuration is not limited to this. A mechanism on the printing apparatus 10 side may perform at least one of attachment of exchange module 81 to cleaning member conveyance jig 140 or attachment of exchange module 81 to loading member 84. For example, cleaning section 80 may include a mechanism that raises and lowers exchange module 81.

In an embodiment above, printing control section 11 detects the exchange timing of cleaning member 82 based on a signal from takeup check sensor 85, but the configuration is not limited to this. The exchange timing may be timing at which it is taken that cleaning member 82 has run out of sheet, but it is not necessary to determine whether cleaning member 82 has actually run out of sheet. For example, printing control section 11 may perform cleaning member exchange processing after cleaning processing has been performed a specified quantity of times after attaching exchange module 81 to loading member 84, that is, after exchanging cleaning member 82. Alternatively, printing control section 11 may perform cleaning member exchange processing after a specified time has elapsed for printing or operation of printing apparatus 10.

In an embodiment above, exchange timing for cleaning member 82 is when it is taken that cleaning member 82 has run out of sheet, but the configuration is not limited to this. For example, printing control section 11 may perform cleaning member exchange processing when changeover is performed when changing to a different type of board S as the print target. In this case, with cleaning member exchange processing, the cleaning member 82 may be exchanged to a different type of cleaning member 82 in accordance with the print target. Also, in this case, an operator may, in advance, attach an exchange module 81 including the type of cleaning member 82 required for changeover to a cleaning member conveyance jig 140 and accommodate that in accommodation apparatus 100.

In an embodiment above, printing control section 11 performs reading processing during printing, but the configuration is not limited to this. For example, printing control section 11 may perform reading processing first before cleaning member exchange processing when performing cleaning member exchange processing. Alternatively, printing control section 11, instead of performing reading processing, may receive information related to cleaning members 82 and cleaning member conveyance jigs 140 accommodated in accommodation section 102 from management PC 150, or from an operator via inputs into display operation section 98. Also, a rule may be determined in advance about which accommodation regions 103 exchange-use cleaning members 82 and empty cleaning member conveyance jigs 140 are accommodated in. In this case, printing control section 11 may memorize that rule in advance, and printing control section 11 does not have to perform reading processing if an operator accommodates the cleaning member 82 and cleaning member conveyance jig 140 in the accommodation region 103 in accordance with the rule.

In an embodiment above, printing apparatus 10 is provided with reading section 97, but the configuration is not limited to this, for example, accommodation apparatus 100 may be provided with reading section 97. In this case, instead of printing control section 11, accommodation control section 106 may perform the above reading processing, and output the acquired information to printing control section 11. In this case too, it is possible for accommodation control section 106 to perform reading processing without stopping printing processing by printing control section 11.

In an embodiment above, barcode 146 is affixed to cleaning member conveyance jig 140, but the configuration is not limited to this, and a barcode may be affixed to exchange module 81. For example, a barcode may be affixed to at least one of attachment member 83, first and second rollers 81a and 81b, and cleaning member 82. Also, in an embodiment above, barcode 146 is affixed to cleaning member conveyance jig 140, but the configuration is not limited to this, and a code other than a barcode such as another type of 2D code may be affixed.

Descriptions were not given for an embodiment above, but when starting the exchange processing routine, printing control section 11 may determine whether the required exchange-use cleaning member 82 is accommodated in accommodation apparatus 100 based on information read during reading processing. Further, printing control section 11 may, upon determining that a required exchange-use cleaning member 82 is not accommodated, output error information indicating that fact to at least one of display operation section 98 or management PC 150, so as to report to an operator that a cleaning member 82 is missing.

In an embodiment described above, accommodation apparatus 100 is provided with accommodation control section 106, and printing control section 11 controls accommodation apparatus 100 indirectly by outputting commands to accommodation control section 106, but the configuration is not limited to this and accommodation control section 106 may be omitted. In this case, for example, printing control section 11 may directly control conveyance conveyor 104 and conveyor raising and lowering section 105 via communication.

In an embodiment above, accommodation apparatus 100 is provided with a moving section and can be moved by an operator, but the configuration is not limited to this and a moving section does not have to be provided. Also, accommodation apparatus 100 may be configured from an AGV (Automatic Guided Vehicle) that can travel autonomously and is provided with a drive mechanism for driving a moving section. In this case, accommodation apparatus 100 may move to a location at which exchange module 81 including exchange-use cleaning member 82 and cleaning member conveyance jig 140 are stored and may automatically accommodate exchange-use exchange module 81 in accommodation section 102.

In an embodiment above, loading member 84 is configured such that exchange module 81 including cleaning member 82 can be attached, but the configuration may allow selective mounting of a module with a function for other than cleaning of screen mask 55. Examples of this kind of head include a dispensing head for dispensing a viscous fluid onto board S, or an inspection head for performing inspection by imaging board S.

In an embodiment above, printing apparatus 10 performed automatic exchange with accommodation apparatus 100 of cleaning member 82, but the configuration is not limited to this. For example, printing apparatus 10 itself may have at least two holders capable of holding exchange-use exchange modules 81. In this case, an operator may attach exchange-use exchange module 81 to at least one holder in advance, and leave at least one holder empty in advance, such that printing apparatus 10 is able to perform automatic exchange between the holders. In this manner, printing apparatus 10 may perform cleaning member exchange processing without relying on loading and unloading.

In an embodiment above, accommodation apparatus 100 accommodated exchange module 81 inside accommodation section 102 in a state attached to cleaning member conveyance jig 140, but it may be accommodated in a state attached to a holder. For example, accommodation apparatus 100 may accommodate exchange module 81 in a state attached to a holder that cannot be conveyed by conveyance conveyor 104. In an embodiment above, loading and unloading of exchange module 81 to and from printing apparatus 10 is performed by the printing apparatus 10 side. Thus, so long as the accommodation apparatus 100 side can raise and lower the holder to which exchange module 81 can be attached, it is possible to perform automatic exchange of exchange module 81 to and from printing apparatus 10 without moving the holder to the front or rear.

A printing apparatus and a printing system of the present disclosure may be configured as described below.

In a printing apparatus of the present disclosure, the cleaning section may include an attachment member configured to have the cleaning member attached and including an engaging member configured to engage with a holder, wherein the cleaning member moving section, by moving the cleaning member, moves the cleaning member to and from the cleaning position and the holder, and the exchange control section may be configured to, during the cleaning member exchange processing, control the cleaning member moving section to exchange the attachment member together with the cleaning member to and from the holder and the cleaning section. Accordingly, with the printing apparatus, when performing automatic transfer of the cleaning member to and from the holder, for example, even if the cleaning member is a shape difficult to attach directly to the holder, or if the cleaning member is in a state difficult to attach directly to the cleaning section, by exchanging the entire attachment member including the engaging sections that engage with the holder, it is easy to perform automatic exchange of the cleaning member.

In a printing apparatus of the present disclosure, the cleaning section may include a loading member on which the attachment member is loaded, and a support member configured to support the loading member from a first direction along a horizontal direction, the cleaning member moving section may include a mechanism configured to move the cleaning member by moving the support member in a second direction that is along the horizontal direction and perpendicular to the first direction, and a mechanism configured to relatively move the loading section with respect to the support member in the second direction, the engaging section may include a protruding section protruding from the attachment section at both sides in the first direction, and the exchange control section may be configured to, during the cleaning member exchange processing, control the cleaning member moving section such that when the attachment member is transferred to and from the holder, the loading member protrudes with respect to the support member at a side of the holder in the second direction. Thus, the printing apparatus, in a case in which the protruding sections that protrude from the both sides of the attachment member in the first direction and the holder are made to engage or release from each other, the loading member is made to protrude to the holder side in the second direction with respect to the support member, such that interference is unlikely to occur between the holder and the support member. Accordingly, the printing apparatus is able to easily perform automatic exchange of the cleaning member.

In a printing apparatus of the present disclosure that exchanges the entire attachment member with the cleaning member, the printing apparatus may include the holder and a raising and lowering section of the holder and is configured to perform loading and unloading of the attachment member to and from an accommodation apparatus configured to accommodate an exchange-use attachment member, and the exchange control section may be configured to, during the cleaning member exchange processing, by using the raising and lowering section to raise and lower the holder, perform at least one of causing the engaging section of the attachment member including the cleaning member to engage with the holder such that the attachment member is attached to the holder, or release the engagement of the engaging section of the attachment member attached to the holder from the holder to attach the engaging section to the cleaning section. Accordingly, the printing apparatus is able to perform at least one of using the raising and lowering section of the accommodation apparatus to transfer the attachment member to the holder or remove the attachment member from the holder, so there is no need for the printing apparatus itself to be provided with a mechanism for performing this.

In a printing apparatus of the present disclosure, the cleaning member may be a wiping sheet configured to clean by being wiped on the screen mask, the cleaning section may include a feeding section configured to feed the wiping sheet and a takeup section configured to take up the wiping sheet, and may be configured to perform the cleaning processing using a portion of the wiping sheet fed by the feeding section, and to perform sheet feeing processing of using the feeding section to feed the portion of the wiping sheet used to perform the cleaning processing, and further provided may be a detection section configured to detect an exchange timing at which the wiping sheet is taken to have run out, and the exchange control section may be configured to perform the cleaning member exchange processing when the detection section has detected the exchange timing. Accordingly, the printing apparatus is able to automatically exchange the wiping sheet when exchange of the wiping sheet is required.

In a printing apparatus of the present disclosure, the exchange control section may perform at least a portion of the cleaning member exchange processing in parallel with printing. Accordingly, the printing apparatus is able to shorten the time for which printing is stopped in order to exchange the cleaning member.

A printing system of the present disclosure may include: any of the forms of printing apparatus disclosed above; and an accommodation apparatus configured to accommodate the exchange-use cleaning member and to enable unloading and loading of the cleaning member to and from the printing apparatus. Thus, the printing system, similar the printing apparatus disclosed above, for example, is able to perform automatic exchange of the cleaning member. Note that, an accommodation apparatus of the printing system may be realized as one of the various forms of accommodation apparatus disclosed above, and various configuration elements may be added to an accommodation apparatus disclosed above.

INDUSTRIAL APPLICABILITY

The present disclosure may be applied to a printing apparatus that prints a viscous fluid onto a print target such as a board.

REFERENCE SIGNS LIST

1: printing system;
10: printing apparatus;
11: printing control section;
20: print process section;
21: printing head;
22: printing moving section;
23: squeegee raising and lowering section;
23a: piston rod;
30: squeegee;
30a, 30b: first and second squeegee;
40: supply section;
41: supply head;
49: cartridge;
50: mask work section;
51: mask fixing section;
52: position adjusting section;
53: conveyance rail;
55: screen mask;
56: mask main body;
57: frame;
57a: barcode;
58: hole pattern;
60: board fixing section;
61: board conveyance conveyor;
65: board raising and lowering section;
70: board support member;
80: cleaning section;
81: exchange module;
81a: first roller;
81b: second roller;
82: cleaning member;
83: attachment member;
83a: case body;
83b: shaft receiver;
83c: gear;
83d: protruding section;
83e: receiving member;
83f: opening section;
83g: engaging shaft;
84: loading member;
84a: contacting member;
84b: raising and lowering device;
84c: claw member;
84d: connecting section;
85: takeup check sensor;
85a: sensor dog;
85b: photo sensor;
85c: rotation arm;
85d: rotation shaft;
85e: spring;
86: support member;
86a: winding motor;
86b: gear;
86c: lock mechanism;
86d: lock member;
87: cleaning moving section;
88: support member moving mechanism;
88a: Y-axis slider;
88b: guide rail;
89: loading member moving mechanism;
89a: drive source;
89b: connecting section;
89c: expansion rail;
97: reading section;
98: display operation section;
100: accommodation apparatus;
101: housing;
102: accommodation section;
103: accommodation region;
103a to 103d: first to fourth accommodation regions;
104: conveyance conveyor;
104a to 104d: first to fourth conveyance conveyors;
105: conveyor raising and lowering section;
106: accommodation control section;
140: cleaning member conveyance jig;
141: frame;
142: protrusion holding section;
146: barcode;

150: management PC;
S: board

The invention claimed is:

1. A printing apparatus comprising:
a cleaning section including a cleaning member and configured to perform cleaning processing of a screen mask used in printing of a viscous fluid onto a print target;
a cleaning member moving section configured to perform at least one of moving the cleaning member to and from a cleaning position and an exchange position, and unloading and loading of the cleaning member;
a holder that holds an exchange-cleaning member; and
an exchange control section configured to control the cleaning member moving section to perform cleaning member exchange processing of exchanging the cleaning member with the exchange-cleaning member.

2. The printing apparatus according to claim 1, wherein
the cleaning section includes an attachment member configured to have the cleaning member attached and including an engaging member configured to engage with the holder, wherein
the cleaning member moving section, by moving the cleaning member, moves the cleaning member to and from the cleaning position and the holder, and
the exchange control section is configured to, during the cleaning member exchange processing, control the cleaning member moving section to exchange the attachment member together with the cleaning member to and from the holder and the cleaning section.

3. The printing apparatus according to claim 2, wherein
the cleaning section includes a loading member on which the attachment member is loaded, and a support member configured to support the loading member from a first direction along a horizontal direction,
the cleaning member moving section includes a mechanism configured to move the cleaning member by moving the support member in a second direction that is along the horizontal direction and perpendicular to the first direction, and a mechanism configured to relatively move the loading section with respect to the support member in the second direction,
the engaging section includes a protruding section protruding from the attachment section at both sides in the first direction, and
the exchange control section is configured to, during the cleaning member exchange processing, control the cleaning member moving section such that when the attachment member is transferred to and from the holder, the loading member protrudes with respect to the support member at a side of the holder in the second direction.

4. The printing apparatus according to claim 2, wherein
the printing apparatus includes the holder and a raising and lowering section of the holder and is configured to perform loading and unloading of the attachment member to and from an accommodation apparatus configured to accommodate an exchange-use attachment member, and
the exchange control section is configured to, during the cleaning member exchange processing, by using the raising and lowering section to raise and lower the holder, perform at least one of causing the engaging section of the attachment member including the cleaning member to engage with the holder such that the attachment member is attached to the holder, or release the engagement of the engaging section of the attachment member attached to the holder from the holder to attach the engaging section to the cleaning section.

5. A printing apparatus comprising:
a cleaning section including a cleaning member and configured to perform cleaning processing of a screen mask used in printing of a viscous fluid onto a print target;
a cleaning member moving section configured to perform at least one of moving the cleaning member to and from a cleaning position and an exchange position, and unloading and loading of the cleaning member; and
an exchange control section configured to control the cleaning member moving section to perform cleaning member exchange processing of exchanging the cleaning member, wherein
the cleaning member is a wiping sheet configured to clean by being wiped on the screen mask,
the cleaning section includes a feeding section configured to feed the wiping sheet and a takeup section configured to take up the wiping sheet, and is configured to perform the cleaning processing using a portion of the wiping sheet fed by the feeding section, and to perform sheet feeing processing of using the feeding section to feed the portion of the wiping sheet used to perform the cleaning processing,
further provided is a detection section configured to detect an exchange timing at which the wiping sheet is taken to have run out, and
the exchange control section is configured to perform the cleaning member exchange processing when the detection section has detected the exchange timing.

6. The printing apparatus according to claim 1, wherein
the exchange control section is configured to perform at least a portion of the cleaning member exchange processing in parallel with the printing.

7. A printing system comprising:
a cleaning section including a cleaning member and configured to perform cleaning processing of a screen mask used in printing of a viscous fluid onto a print target;
a cleaning member moving section configured to perform at least one of moving the cleaning member to and from a cleaning position and an exchange position, and unloading and loading of the cleaning member;
an exchange control section configured to control the cleaning member moving section to perform cleaning member exchange processing of exchanging the cleaning member; and
an accommodation apparatus configured to accommodate an exchange-use cleaning member and to enable unloading and loading of the cleaning member to and from the printing apparatus.

* * * * *